United States Patent [19]

Glomb, Jr.

[11] Patent Number: 4,766,357
[45] Date of Patent: Aug. 23, 1988

[54] DEMAGNETIZATION COMPENSATED MAGNETOSTRICTIVE ACTUATOR

[75] Inventor: Walter L. Glomb, Jr., West Willington, Conn.

[73] Assignee: United Technologies Corporation, Hartford, Conn.

[21] Appl. No.: 18,798

[22] Filed: Feb. 19, 1987

Related U.S. Application Data

[63] Continuation of Ser. No. 685,939, Dec. 24, 1984, abandoned.

[51] Int. Cl.$^4$ ........................ H02N 2/00; H01L 41/12
[52] U.S. Cl. ........................................ 318/118; 310/26
[58] Field of Search ............................ 310/26; 318/118; 367/168

[56] References Cited

U.S. PATENT DOCUMENTS

| 2,116,522 | 5/1938 | Kunze | 310/26 X |
| 2,566,984 | 9/1951 | Firth | 310/26 |
| 2,930,912 | 3/1960 | Miller | 310/26 |
| 3,633,424 | 6/1972 | Lynnworth | 310/26 |
| 4,096,735 | 6/1978 | Huntzinger et al. | 310/26 |
| 4,374,668 | 2/1983 | Koon | 310/26 X |
| 4,655,560 | 4/1987 | Glomb, Jr. | 350/611 |

OTHER PUBLICATIONS

Allied Chemical, "Materials Research Report: Metglas", 2 pages, Box 1021R, Morristown, N. J. 07960.

Primary Examiner—Patrick R. Salce
Assistant Examiner—D. L. Rebsch
Attorney, Agent, or Firm—Lloyd D. Doigan; J. Kevin Grogan

[57] ABSTRACT

A demagnetization compensated magnetostrictive actuator includes a magnetostrictive displacement element and an excitation element responsive to an external signal for providing an applied magnetic field; it further includes a magnetic yoke configuration that encloses both the displacement and excitation elements, for providing a low magnetic reluctance path for the magnetic flux provided by the applied magnetic field.

6 Claims, 1 Drawing Sheet

DEMAGNETIZATION COMPENSATED MAGNETOSTRICTIVE ACTUATOR

Cross Reference to Related Application

This application is a continuation of Ser. No. 685,939, filed Dec. 24, 1984, now abandoned, and is related to commonly owned, copending application Ser. No. 762,479, entitled "Demagnetization Compensated Deformable Magnetostrictive Mirror," filed Aug. 5, 1985 to Walter L. Glomb, Jr. now U.S. Pat. No. 4,655,560.

1. Technical Field

This invention relates to linear stroke actuators and more particularly to linear stroke actuators employing magnetostrictive action.

2. Background Art

In the past, linear magnetostrictive actuators have found extensive use in sonar applications and have recently been used with the deformable mirrors of high energy laser systems. Magnetostrictive actuators employ materials whose physical dimensions change in a magnetic field. Linear displacement is produced by placing a rod of magnetostrictive material in a solenoid configuration. When current is passed through the electrical coil surrounding the rod, a change in length of the magnetostrictive rod can be observed that is proportional to the magnitude of the applied field.

The prior art contains a number of magnetostrictive linear actuators where the magnetostrictive rod comprises a material such as terfenol ($Tb_{0.27}$ $Dyphd$ $0.73$ $Fe_{1.95}$). Linear actuators made from terfenol or similar materials yield very large displacements; on the order of several tens of micrometers, and make terfenol actuators highly desirable for these high energy laser applications. Although actuators made from terfenol display greater displacement per unit magnetizing field than earlier actuators, they are still burdened by the requirements of a strong magnetizing field with its large associated electrical solenoid current. The compact nature of these actuators coupled with the large current results in a substantial amount of heat being deposited within the actuator. The resultant thermal expansion of the actuators' constituent assemblies must be compensated in order to maintain precision in displacement. In addition, higher gain materials such as terfenol are plagued by large displacement hysteresis.

Other magnetostrictive actuators in the prior art employ a metallic glass such as METGLAS ® 2605CO ($Fe_{0.67}$ $Co_{0.18}$ $B_{0.14}$ $Si_{0.01}$) as the magnetostrictive element. METGLAS ® is quite desirable for precision displacement applications as it displays virtually no hysteresis. Unfortunately, METGLAS ® is an extremely low gain material, so that linear actuators using METGLAS ® display a very small amount of extension per unit solenoid current. In addition, a large demagnetizing field is created within the material because of the high magnetic permeability of METGLAS ®. The effect of this field is to cause the magnetostrictive characteristics of an actuator containing METGLAS ® to be nonlinear and to require a large applied magnetic field to operate.

Disclosure of Invention

The object of the present invention is to provide a linear magnetostrictive actuator with demagnetization compensation having improved displacement accuracy.

According to the present invention, a demagnetization compensated magnetostrictive actuator, responsive to an external signal, includes a displacement element comprising magnetostrictive material that provides actuator displacement in response to the magnitude of an applied magnetic field and includes excitation means for providing the magnetic field. The actuator further includes a magnetic yoke configuration that encloses both the displacement element and the excitation element that provides a low magnetic reluctance path for the magnetic flux provided by the magnetic field and which positions the displacement means and excitation means therein.

According to another aspect of the present invention, the magnetic yoke configuration includes a magnetic yoke cylinder comprising an annular cylinder of low magnetic reluctance material and further includes end caps comprising low magnetic reluctance material that abut both the yoke cylinder and the displacement element providing magnetic reluctance continuity therebetween.

According to yet another aspect of the invention, the end caps comprise cylinders having annular grooves for accepting the magnetic yoke cylinder and the displacement element.

BEST MODE FOR CARRYING OUT THE INVENTION

Figure 1:
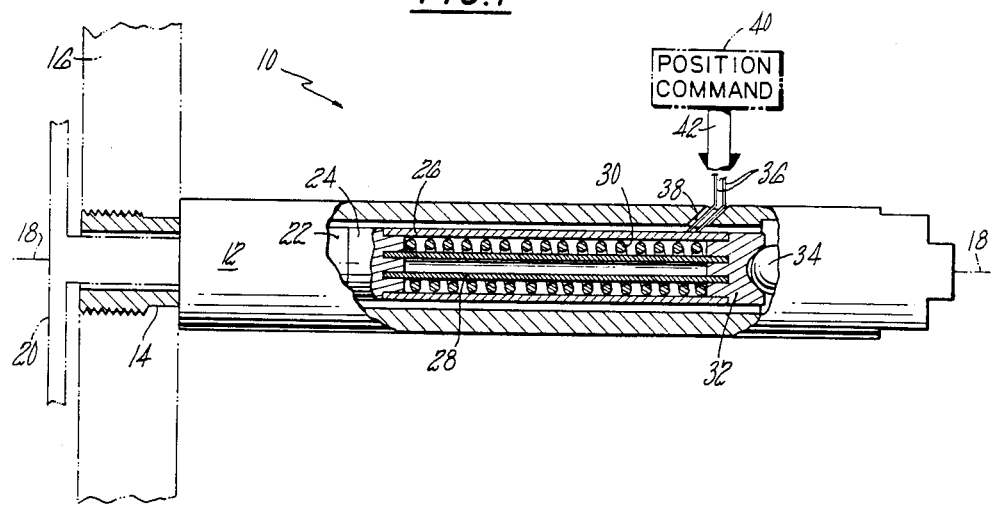
FIG. 1 is an illustration, partially in section and partially in perspective, of a demagnetization compensated magnetostrictive actuator for use with the present invention.

Referring to FIG. 1, in an illustration partially in perspective and partially in section of a demagnetization compensated magnetostrictive actuator of the present invention, the demagnetization compensated magnetostrictive actuator 10 includes actuator casing 12 which comprises a hollow metallic cylinder to which casing locator 14 is fastened by welding or other means. This assemblage is threaded into actuator mount 16. The locator is annular with a center opening coaxial with displacement axis 18. Load 20 is inserted through the center of the opening of the casing locator where it contacts coupling means 22, only partially shown, within the actuator casing.

Abutting the coupling means is end cap 24 which has concentric annular grooves machined into one face of the cap so that a magnetic yoke cylinder 26 and an inner displacement cylinder 28 of magnetostrictive material can be contiguously positioned thereto. Electrical coil 30 is disposed on the displacement cylinder and is enclosed by the yoke cylinder.

In the best mode embodiment, the displacement cylinder comprises an annular cylinder formed from rolled METGLAS ® sheet. METGLAS ® possesses a high magnetic permeability, approximately ten thousand times that of air. The cylinder has an inner diameter of approximately two millimeters and an outer diameter of approximately six millimeters. The yoke cylinder enclosing both the coil and the displacement cylinder comprises an annular cylinder of rolled METGLAS ® sheet having an outer diameter of ten millimeters and an inner diameter of eight millimeters. The electrical coil comprises a coil with one thousand turns of No. 28 wire. Although the materials and dimensions are mentioned hereinabove for the yoke cylinder, the displacement cylinder and the coil are indicative of the best mode, and those skilled in the art will recognize that equivalent means can be substituted.

Fastened at the other end of this cylindrical asemblage is end cap 32. Both ends caps are comprise metal or other suitable magnetic material possessing a large magnetic permeability. In the best mode embodiment, the end caps are fabricated from cold rolled steel. Contacting end cap 32 is adjustment bolt 34 which provides the actuator with coarse positioning of the load. Wires 36 carrying an external position command signal for the coil enter the casing through aperture 38.

In operation, position command circuitry 40 provides a position command signal on lines 42. The position command circuitry is part of the parent control system in which the actuator may be used, but is not part of the present invention. The actuator responds to the position signal magnitude by producing a displacement along axis 18, either extension or retraction. As a result, the load is moved linearly along the axis relative to the actuator mount.

A magnetic field is induced within the electrical coil by the current component of the position command signal. It is well known that magnetostrictive metallic glasses such as METGLAS ® experience a stress when placed in an applied field. In the case of the displacement cylinder, fixed at one end by the adjustment bolt, the concomitant strain produces a change in length that displaces the load. The displacement (D) is expressed as $$D = HKl_c$$

where H is the magnetizing field, K is the strain gain constant, and $l_c$ is the quiescent length of the displacement cylinder.

Figure 2:
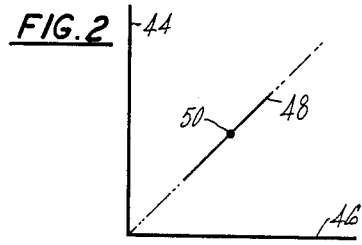
FIG. 2 is an illustration of a distinctive magnetic property of a magnetostrictive material used in the actuator of FIG. 1.

FIG. 2 displays a pertinent part of the relationship between the applied magnetic field and the magnetostrictive displacement of the displacement cylinder. The axes 44, 46 correspond to displacement and magnetic field strength respectively. Curve 48 illustrates a section of the displacement versus applied magnetic field relationship. Since all values of the applied field produce positive displacement, the METGLAS ® displacement cylinder must be biased by an applied magnetic field in order to display both extension and contraction. Bias point 50 represents the quiescent value about which the actuator is operated. The magnetic field generated by current flow through the coil produces the desired displacement about this bias point, as well as the bias magnetic field.

As hereinafter detailed in FIG. 3, the end caps (32 and 24, FIG. 1), together with the magnetic yoke cylinder (26, FIG. 1) comprise a magnetic yoke configuration that provides a return path for the magnetic flux of the applied field. This magnetic yoke configuration reduces a demagnetizing field within the displacement cylinder, increasing the gain and linearity of the actuator.

Figure 3:
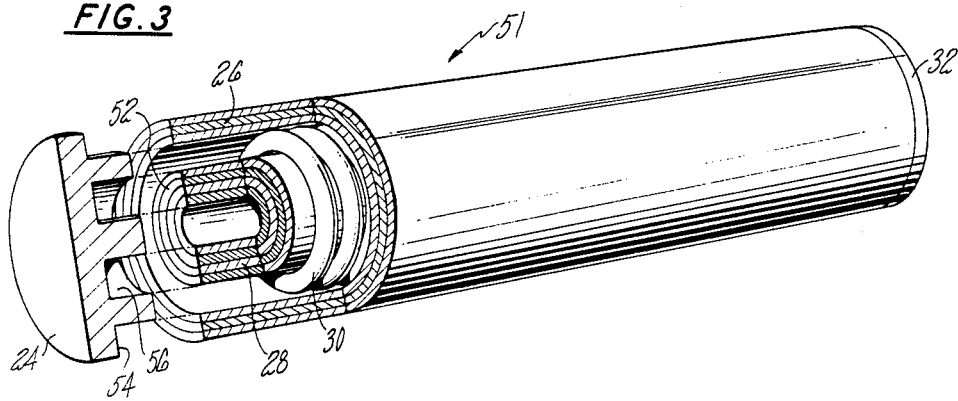
FIG. 3 is an illustration, partially in perspective and partially and in section, of an assemblage of selected elements of the magnetostrictive actuator of FIG. 1.

FIG. 3 is an illustration, partially in perspective and partially in section, of selected assembled elements 51 of the actuator of FIG. 1. Magnetic yoke cylinder 26 encloses electrical coil 30 and magnetostrictive displacement cylinder 28, respectively. When the actuator is assembled, end cap 24 is positioned so as to closely abut both the displacement magnetostrictive cylinder and the magnetic yoke cylinder. End cap 24 is shown positioned away from cylinders 26 and 28 for purposes of illustration. Partially visible in this illustration is end cap 32 contiguously fastened at the opposite end of the aforesaid cylinders.

Without the magnetic yoke configuration, the magnetic flux of the applied magnetic field exits the high magnetic permeability region of the displacement cylinder into the low magnetic permeability region of the surrounding air. The air outside the cylinder provides a very high magnetic reluctance return path for the magnetic flux. Physically this results in a large number of uncompensated magnetic poles being created at end face 52 and a complementary end face (not shown) of the displacement cylinder.

The presence of uncompensated magnetic poles reduces the magnitude of the applied magnetic field within the magnetostrictive material by an amount ΔH, called a demagnetizing field, and is nearly proportional to the intensity of the magnetization. The effective magnetic field (H) within the magnetostrictive displacement cylinder is the difference between the applied field ($H_O$) and the demagnetizing field, or $$H = H_0 - \Delta H$$

The effect of the demagnetizing field is largest with those magnetostrictive which possess a high magnetic permeability. Iron cobalt metallic glasses such as METGLAS ® have a magnetic permeability of approximately ten thousand times that of air. Consequently, the magnitude of the demagnetizing field with a displacement cylinder of METGLAS ® is quite large when used in actuator configurations without a magnetic yoke configuration.

In order to reduce the magnitude of this demagnetizing field, the demagnetization compensated magnetostrictive actuator of the present invention provides a low magnetic reluctance path for the magnetic flux associated with the magnetic field by employing a magnetic yoke configuration. The configuration comprises the magnetic end caps contiguously fastened to the end faces of the displacement cylinder combined with the magnetic yoke cylinder, contiguously fastened to the end caps and enclosing the electrical coil and displacement cylinder.

Those skilled in the art will note that the effectiveness of the magnetic yoke configuration in reducing the magnitude of the demagnetizing field is greatly influenced by the end caps' geometrical design and by the permeability difference between the displacement cylinder and the end caps and the yoke cylinder and the end caps. Gaps of any magnitude between the displacement cylinder and the end cap, and the magnetic yoke cylinder and the end cap substantially reduce actuator performance. In the best mode embodiment, the end caps, displacement cylinder and magnetic yoke cylinder are fabricated so that any gaps therebetween are less than fifty micrometers in dimension.

In the best mode embodiment, the end caps are each fabricated with annular grooves configured to be concentric with the displacement axis and each other.

Grooves 54 and 56 are shown on end cap 24. Groove 54 positions the displacement cylinder while groove 56 positions the magnetic yoke cylinder. As detailed hereinabove, the displacement and magnetic yoke cylinder must be contiguous with the end caps. Bonding means (not shown) must be applied on the end cap so as to provide structural integrity and to keep each end cap-cylinder interface contiguous.

In addition, the grooves mitigate the demagnetizing effect of any step in permeability magnitudes between the METGLAS ® or equivalent magnetostrictive material used for the displacement cylinder and magnetic yoke cylinder and the magnetic end caps. In the best mode embodiment, the end cap comprises cold rolled steel which has a magnetic permeability of approximately five hundred times greater than that of air. Consequently, the steel end cap provides a high reluctance path for magnetic flux when compared to that of the METGLAS ®. Positioning the displacement cylinder and yoke cylinder in grooves allows the surfaces that are perpendicular to the groove face to provide additional compensation for uncompensated magnetic poles that are located at the corners of the end faces of both cylinders.

Figure 4:
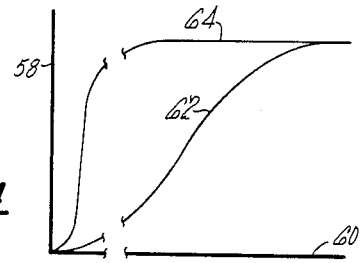
FIG. 4 is an illustration of another distinctive property of a magnetostrictive material used in the actuator of FIG. 1.

FIG. 4 is an illustration of the displacement versus applied field characteristics of an actuator having a METGLAS ® displacement cylinder with a magnetic yoke configuration and one without a magnetic yoke configuration. Axes 58 and 60 correspond to displacement and magnetic intensity respectively. Curve 62 illustrates the performance of an actuator with a displacement cylinder of METGLAS ® but without any magnetic yoke. The gentle curve and shallow slope of the curve 62 is indicative of the effect of the demagnetizing field created in the material because of the uncompensated magnetic poles. Curve 64 illustrates the performance of an actuator having a displacement cylinder of METGLAS ® but with a magnetic yoke configuration consisting of steel end caps and a yoke cylinder of METGLAS ® as hereinbefore described. The slope of curve 64 is approximately one hundred times steeper than that of curve 62, indicating that the demagnetizing field is reduced in the METGLAS ® displacement cylinder by a factor of one hundred by utilizing the magnetic yoke configuration.

Similarly, although the invention has been shown and described with respect to a best mode embodiment thereof, it should be understood by those skilled in the art that various other changes, omissions, and additions thereto may be made therein without departing from the spirit and scope of the invention.

I claim:

1. A magnetostrictive actuator which provides for displacement along an axis in depedence on the magnitude of an external signal comprising:
   displacement element means having a first and a second end portion and comprising a high magnetic permeablity metallic glass, for providing said displacement along said axis in proportion to an applied magnetic field,
   excitation means disposed about said displacement element means for providing said magnetic field to said displacement element means at a magnitude in dependence on the magnitude of said external signal, and
   a magnetic yoke means enclosing said displacement means for providing a low magnetic reluctance path for magnetic flux provided by said magnetic field for minimizing uncompensated magnetic poles so that said displacement means is displaced along said axis in approximately linear proportion to said applied magnetic field.

2. The magnetostrictive actuator of claim 1 wherein said magnetic yoke means comprises a cylinder of high magnetic permeability metallic glass having a first and a second end portion.

3. The magnetostrictive actuator of claim 2 wherein said magnetic yoke configuration means further comprises a pair of end cap means, a first end cap means abutting said first end portion of said cylinder and said first end portion of said displacement means and a second end cap means abutting said second end portion of said cylinder and said second end portion of said displacement element means for providing a low magnetic reluctance path for said magnetic field.

4. The magnetostrictive actuator of claim 3 wherein said end cap means each have an inner and an outer annular groove in a face thereof, said grooves being concentric with said axis and with each other, said inner groove being adapted to abut either of said first or second end portion of said displacement element, said outer groove being adapted to abut the respective either of said first or second end portion of said cylinder.

5. A magnetostrictive actuator which provides for displacement along an axis in dependence on the magnitude of an external signal comprising:
   a first displacement means comprising a magnetostrictive material, for providing said displacement along said axis in proportion to an applied magnetic field, and for providing a portion of a magnetic flow path for magnetic flux provided by said magnetic field,
   a second displacement means comprising a magnetostrictive material and enclosing said first displacement means, for providing said displacement along said axis, with said first displacement means, in proportion to said applied magnetic field and for providing a second portion of a magnetic path for magnetic flux provided by said magnetic field said first and second flow portion minimizing uncompensated magnetic poles so that said first and second displacement means are displaced along said axis in approximately linear proportion to said applied magnetic field, and
   excitation means disposed between said first and second displacement means for providing said magnetic field to said first and second displacement means at a magnitude in dependence on the magnitude of said external signal.

6. The actuator of claim 5 wherein said first and second displacement means comprise a right magnetic permeability metallic glass.

\* \* \* \* \*

UNITED STATES PATENT AND TRADEMARK OFFICE
CERTIFICATE OF CORRECTION

PATENT NO. : 4,766,357
DATED : August 23, 1988
INVENTOR(S) : Walter L. Glomb

It is certified that error appears in the above-identified patent and that said Letters Patent is hereby corrected as shown below:

Claim 1, column 5, line 54, "depedence" should read --dependence--.

Claim 1, column 5, line 58, "permeablity" should read --permeability--.

Claim 6, column 6, line 60, "right" should read --high--.

Signed and Sealed this

Twenty-eighth Day of February, 1989

Attest:

DONALD J. QUIGG

Attesting Officer

Commissioner of Patents and Trademarks